(12) United States Patent  
Lou

(10) Patent No.: US 6,271,083 B1  
(45) Date of Patent: Aug. 7, 2001

(54) METHOD OF FORMING A DRAM CROWN CAPACITOR

(75) Inventor: Chine-Gie Lou, Hsinchu Hsien (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/395,187

(22) Filed: Sep. 14, 1999

(30) Foreign Application Priority Data

Aug. 27, 1999 (CN) ................................................ 88114767

(51) Int. Cl.$^7$ ................................................ H01L 21/8242
(52) U.S. Cl. .......................... 438/253; 438/240; 438/256; 438/396; 438/399
(58) Field of Search ................................ 257/306, 307, 257/308, 309, 310; 438/253, 254, 255, 396, 397, 398, 399, 256, 240, 3

(56) References Cited

U.S. PATENT DOCUMENTS

| | | | |
|---|---|---|---|
| 5,374,580 | 12/1994 | Baglee et al. | 438/243 |
| 5,552,355 | 9/1996 | Cava et al. | 501/137 |
| 5,619,051 | 4/1997 | Endo | 257/316 |
| 5,668,041 | * 9/1997 | Okudaira et al. | 438/240 |
| 5,686,339 | * 11/1997 | Lee et al. . | |
| 5,691,219 | * 11/1997 | Kawakubo et al. . | |
| 5,825,055 | 10/1998 | Summerfelt | 257/183 |
| 5,843,818 | * 12/1998 | Joo et al. | 438/240 |
| 5,879,985 | * 3/1999 | Gambino et al. | 438/253 |
| 5,920,761 | * 7/1999 | Jeon | 438/3 |
| 5,952,687 | * 9/1999 | Kawakubo et al. | 257/296 |
| 5,976,928 | * 11/1999 | Kirlin et al. | 438/240 |
| 6,030,847 | * 2/2000 | Fazan et al. | 438/3 |
| 6,051,859 | * 4/2000 | Hosotani et al. | 257/306 |
| 6,066,528 | * 5/2000 | Fazan et al. | 438/253 |
| 6,071,770 | * 6/2000 | Roh | 438/240 |

* cited by examiner

*Primary Examiner*—Stephen D. Meier  
*Assistant Examiner*—Toniae M. Thomas

(57) ABSTRACT

A method of forming a DRAM capacitor comprises the following steps in the sequence set forth. First, a first silicon oxide layer is formed on a substrate, and a nitride layer is then deposited on the first silicon oxide layer. Next, uses photolithography and etching process to define a contact hole, and then, fills polysilicon into the contact hole. Further, the partial polysilicon in the top contact hole is removed, sequently, W-metal (selective tungsten metal) is filled into the blank part in the top contact hole. Then, a second silicon oxide layer is deposited on surfaces of the nitride layer and the W-metal (selective tungsten metal). Subsequently, etchs back the second silicon oxide layer to form a trench, thus, the W-metal (selective tungsten metal) would be exposed in the trench. Furthermore, a barrier metal layer is formed on the surface of the trench, and a first platinum layer is formed on the barrier metal layer sequently, wherein the first platinum layer and the barrier metal layer act as the bottom electrode. Further, a dielectric layer is deposited on the first platinum layer and the second silicon oxide layer using BST material. Finally, a second platinum layer is formed on the dielectric layer to act as top electrode.

17 Claims, 4 Drawing Sheets

METHOD OF FORMING A DRAM CROWN CAPACITOR

BACKGROUND OF INVENTION

1. Field of the Invention

The present invention generally relates to a method of forming a DRAM crown capacitor, and more precisely to a method of forming a DRAM crown capacitor with BST (barium strontium titanate) as the dielectric layer of the capacitor.

2. Background of the Related Art

To shrink the device size is one of the aspects in the semiconducting industry. Since the sizes of the memory cells are scaled-down, the capacitance of the memory-capacitor must be refreshed frequently to maintain the storage the data of the memory cells. Otherwise, the capacitance of the memory-capacitor should be upgraded while the packaging density is increased. New materials or new structures of memory-capacitor are needed for improvement of the semiconducting industry.

Prior arts for overcoming these problems have resulted in the development of the trench capacitor (referrong to example U.S. Pat. No. 5,374,580) and the stacked capacitor. The trench capacitor has well-known problem of "gated didoe leakage," which is the leakage of current resulting in the trench capacitor failing to hold a charge. Reducing the thickness of the capacitor dielectric also can improve the capacitance of the capacitor, but this approach is limited because of yield and reliabilty problems.

High dielectric material BST (barium strontium titanate) is widely regards as the capacitor dielectric for 1G or 4 G DRAM. Prior arts using the BST to serve as the dielectric films of memory cells have been published. For example, one prior art is referred to U.S. Pat. No. 5,619,051 entitled of "Semiconductor Nonvolatile Memory Cell" has been reported by Nobuhiro Endo. In the patent the BST is used to act as second dielectric films. Further, S. R. Summerfeild et al. have disclosed using BST to serve as the dielectric layer of the semiconductor in U.S. Pat. No. 5,825,055 "Fabricating High-dielectric Constant Oxides on Semiconductors Using a GE Buffer Layer".

However, forming the BST layer always needs in high temperature ambience. Referring to the U.S. Pat. No. 5,552,305 reported by R. J. Cava et al., the recipes of forming the BST are disclosed. Otherwise, the attempts to adapt the BST to silicon technology have been intensively carried out, there are few successful results reported because of integration problems. Further, the BST film usually requires high temperature deposition in oxygenic ambiance. Platium (Pt) is the most studied electrode material for BST capacitors due to its high oxidation resistance and low leakage current. But the disadvantages of Pt are that the adhesion on oxide is poor, the Pt is hard to be etched by dry etching. Further, it tempts to react with poly and the cost of formation is higher. Hence, a new structure is developed to solve these problems.

SUMMARY OF THE INVENTION

According to one aspect of the invention is to provide a method of forming a new structure of DRAM capacitor. Especially, it is to provide a method of forming a BST (barium strontium titanate) as the capacitor dielectric and using platium (Pt) as the electrodes of DRAM capacitor.

The method of forming the DRAM capacitor comprises the following steps. First, a substrate is provided for forming capacitor on the substrate wherein the substrate has at least one transistor on it. Then, a silicon oxide layer is formed on the substrate. Then, a nitride layer is formed on the silicon oxide layer. After etching the nitride layer and the silicon oxide layer, a contact hole for forming plug is then formed on the substrate. Therefore, the source/drain of the transistor is exposed in the contact hole. Subsequently, a polysilicon is filled in the contact hole. Sucessively, the W-metal (selective tungsten metal) is deposited on the polysilicon for protecting the polysilicon from a platinum layer wherin the platinum layer is formed in the following step. Furthermore, the surface of the W-metal (selective tungsten metal) is exposed outside the nitride layer and is planed with the nitride layer. Then, an oxide layer is deposited on the nitride layer and W-metal (selective tungsten metal). The oxide layer is then patterned to form a trench wherein the trench is for use to form a crown capacitor; and further, the W-metal (selective tungsten metal) and partial nitride layer are exposed in the trench. Then, a barrier metal layer is formed on the trench, the oxide layer, the partial nitride layer and W-metal (selective tungsten metal). Next, the platinum layer is formed on the barrier metal layer. The barrier metal layer and platinum layer act as the bottom electrode of DRAM capacitor. Further, a photo resist is formed on the platinum layer for use to protect the bottom electrode layer. Using CMP technique the shape of the bottom electrode can be defined precisely. Subsequently, the photo resist is removed. Then, a dielectric layer is formed on the platinum layer and the oxide layer using BST material. After the dielectric layer is formed, another platinum layer is formed to serve as the top electrode layer on the dielectric layer. Finally, the DRAM capacitor in present invention is fabricated.

DETAILED DESCRIPTION OF THE PREFERRED EMBODIMENTS

Figure 1:
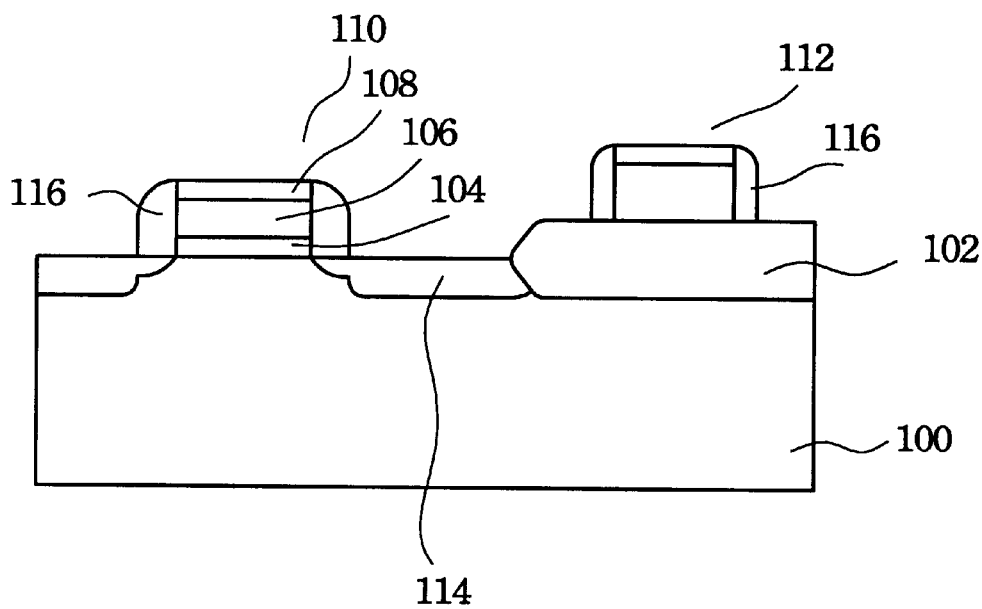
FIG. 1 is a cross-section view of providing a substrate with a transistor according to the present invention.

Referring to FIG. 1, a <100> oriented substrate 100 is provided. At least one transistor is formed on the substrate 100 in sequence set forth. A field-oxide layer (FOX) 102 is formed on the substrate 100 the field-oxide layer is used for isolation between any two adjacent devices on the substrate 100. Therefor, the field-oxide layer 102 is formed using conventional technique wherein the field-oxide layer 102 has a thickness of about 4,000 to 6,000 angstroms. And, a silicon oxide layer 104 is formed on the surface of the substrate 100 for use to serve as the gate oxide layer of the MOSFET. In the embodiment of the invention, the silicon oxide layer 104 is formed using thermal oxidation technique, and the temperature in the thermal oxidation is about 800 to 900° C. Furthermore, a polysilicon layer 106 is formed using LPCVD technique on the field-oxide 102 and the silicon oxide layer 104. It is preferably that the thickness of the polysilicon layer 106 is about 1,000 to 4,000 angstroms. Otherwise, the polysilicon layer 106 can be in situ doped with arsenic or phosphoric ions. After forming the polysilicon layer 106, another silicon oxide 108 is formed on the surface of the polysilicon layer 106 using CVD technique. Then, a gate electrode 110 and bit line 112 are formed using conventional photolithography and anisotropy etching techniques. Then, spacers 116 are formed on both sides of the gate electrode 110 and the bit line 112. The source/drain (namely, it is called active region) 114 of the MOSFET is formed using ion implanting.

Figure 2:
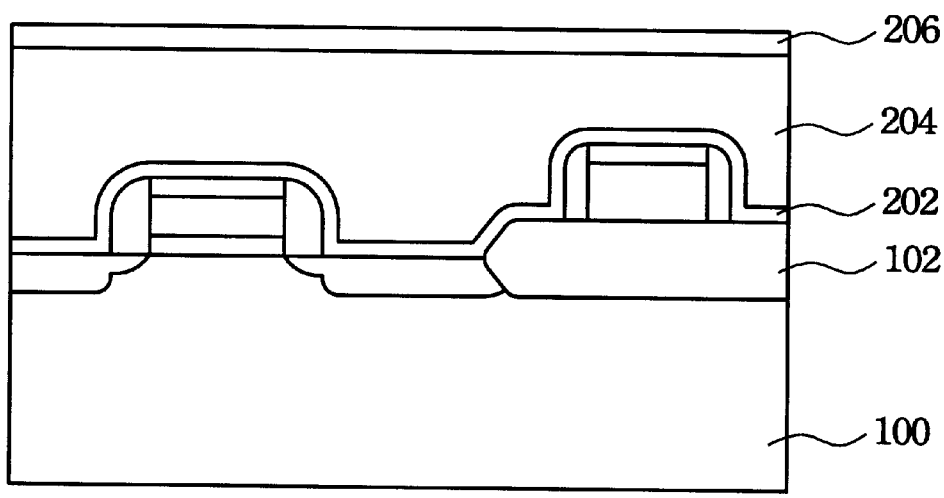
FIG. 2 is a cross-section view of forming a silicon oxide layer and a nitride layer sequential on the substrate according to the present invention.

Referring to FIG. 2, a pad oxide layer 202 is formed using an undoped silicon oxide as material wherein the pad oxide layer 202 is formed on the surfaces of substrate 100, source/drain 114, gate electrode 110, field-oxide layer 102 and bit line 112. Furthermore, an oxide layer 204, such as BPSG or undoped silicon oxide, is formed using CVD technique on the pad oxide layer 202. It is preferably that the oxide layer 204 has a thickness of about 2000 to 6000 angstroms. And then, a nitride layer 206 is deposited on the oxide layer 204 wherein the thickness of the nitride layer 206 is about 300 to 1500 angstroms. The nitride layer 206 has good adhesion with platinum layer formed in the later step, and can improve the adhesion between platinum layer and the oxide layer 204.

Figure 3:
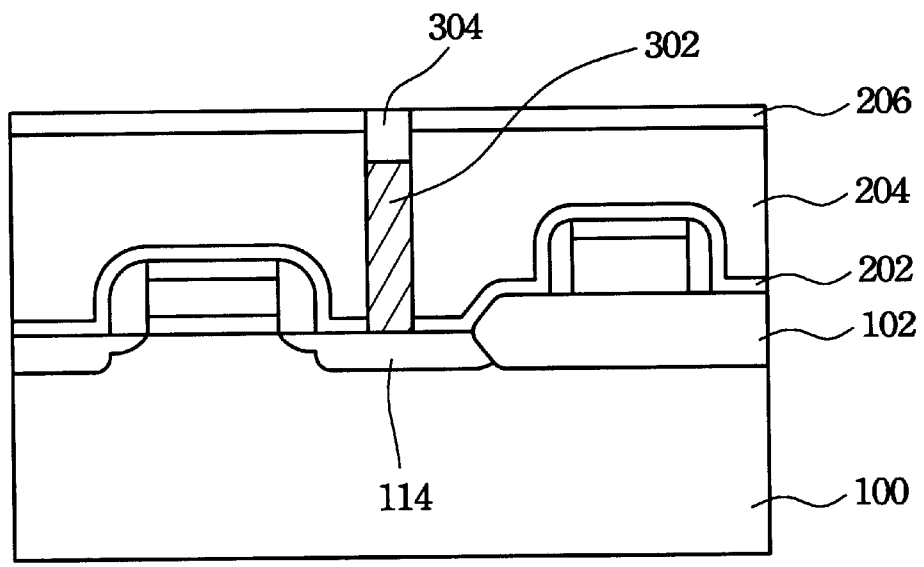
FIG. 3 is a cross-section view of forming a plug on the source/drain of the transistor according to the present invention.

Referring to FIG. 3, the nitride layer 206, the oxide layer 204 and the pad oxide layer 202 is etched back to form a contact hole wherein the contact hole is aligned with the source/drain 114, namely, the source/drain 114 is exposed in the contact hole. Sucessively, the contact hole is use for forming a contact plug in following steps. And then, a polysilicon layer 302 is refilled in the contact hole. The polysilicon layer 302 is formed using LPCVD technique at temperature 520 to 650° C. and in situ doped with phosphoric ions. Therefore, the polysilicon layer 302 on the nitride layer 206 is removed by using RIE (reactive ion etch) technique, and partial of polysilicon layer 302 on the top contact hole is removed using overetch process. Namely, a blank region is formed after removing the partial polysilicon layer 302 wherein the blank region is about 500 to 2000 angstroms deep. Then, the W-metal (selective tungsten metal) 304 is formed in the blank region by using selective tungsten deposition technique. However, the top surface of the W-metal (selective tungsten metal) 304 is equal to the level of the nitride layer 206. While the W-metal (selective tungsten metal) 304 are use for preventing the reaction between the polysilicon layer 302 and the platinum layer formed in the later step. Furthermore, the W-metal (selective tungsten metal) 304 has good barrier attribute, and it is easy fabricated without any other extended etching steps.

Figure 4:
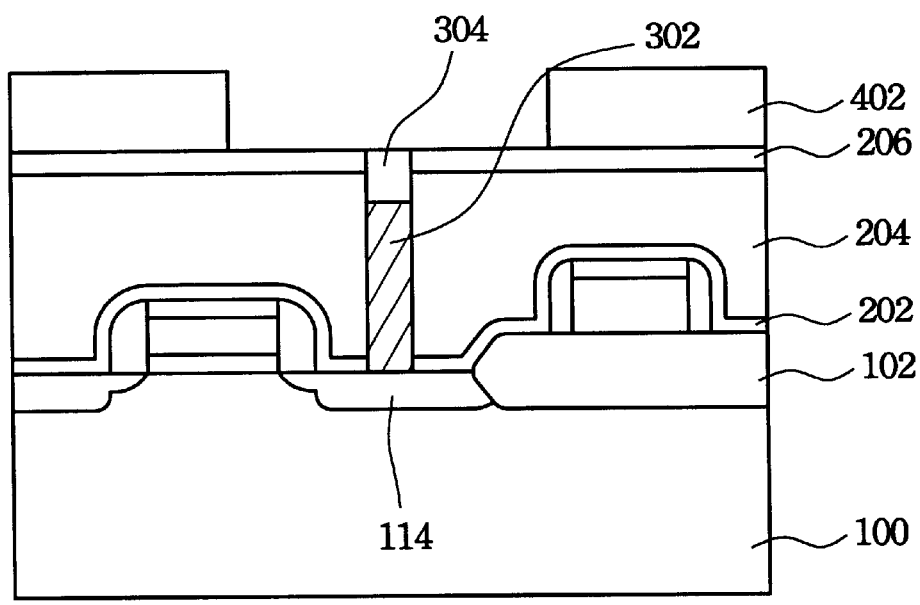
FIG. 4 is a cross-section view of forming an oxide layer on the nitride layer and the plug and forming a crown structure on the oxide layer according to the present invention.

Next, referring to FIG. 4, a silicon oxide layer 402 is formed on the nitride layer 206 and W-metal (selective tungsten metal) 304. The silicon oxide layer 402 is formed using CVD technique at 400 to 750° C., wherein the thickness of the silicon oxide layer 402 is about 2000 to 8000 angstroms. Further, the silicon oxide layer 402 is patterned to form a trench that acts as a crown structure. While the crown structure is use for defining the area of charge-storage of the DARM capacitor. Namely, the surface of W-metal (selective tungsten metal) 304 and partial nitride layer 206 are exposed in the crown structure.

Figure 5:
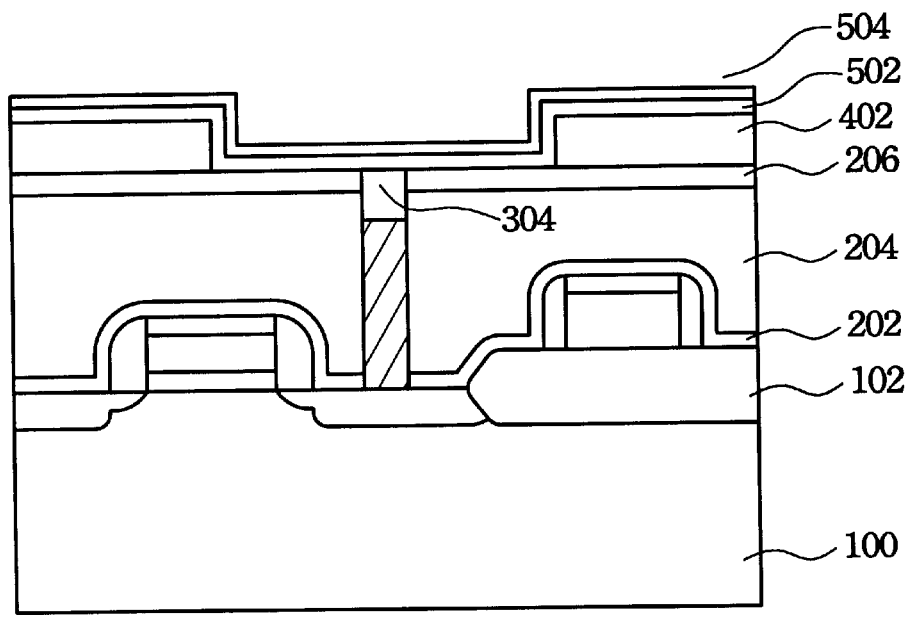
FIG. 5 is cross-section view of forming a barrier metal layer on the crown structure and forming a platinum layer on the barrier metal layer according to the present invention.
Figure 6:
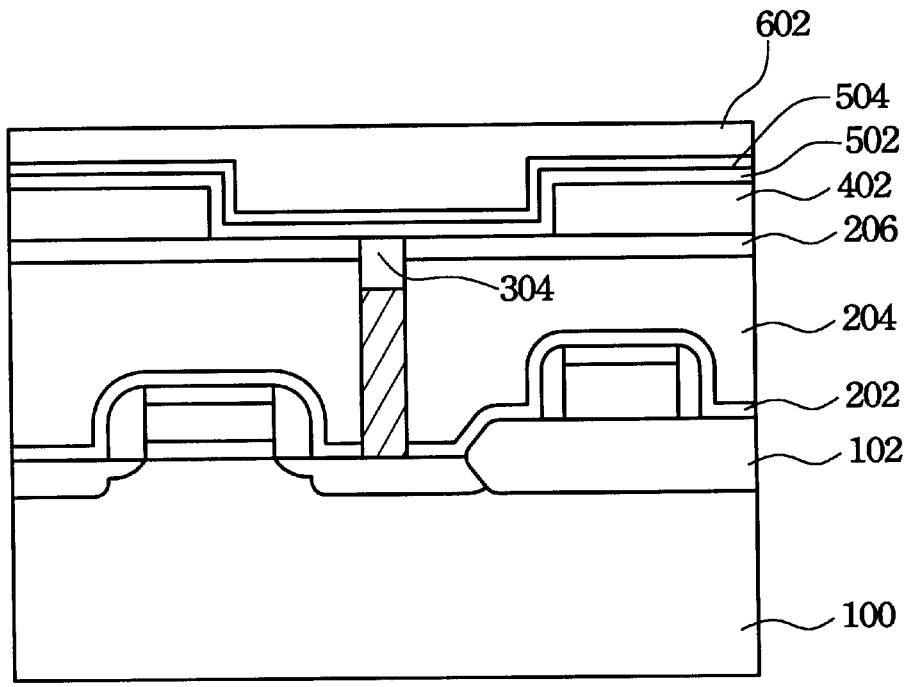
FIG. 6 is a cross-section view of forming a photo resist on the platinum layer and the oxide layer according to the present invention.
Figure 7:
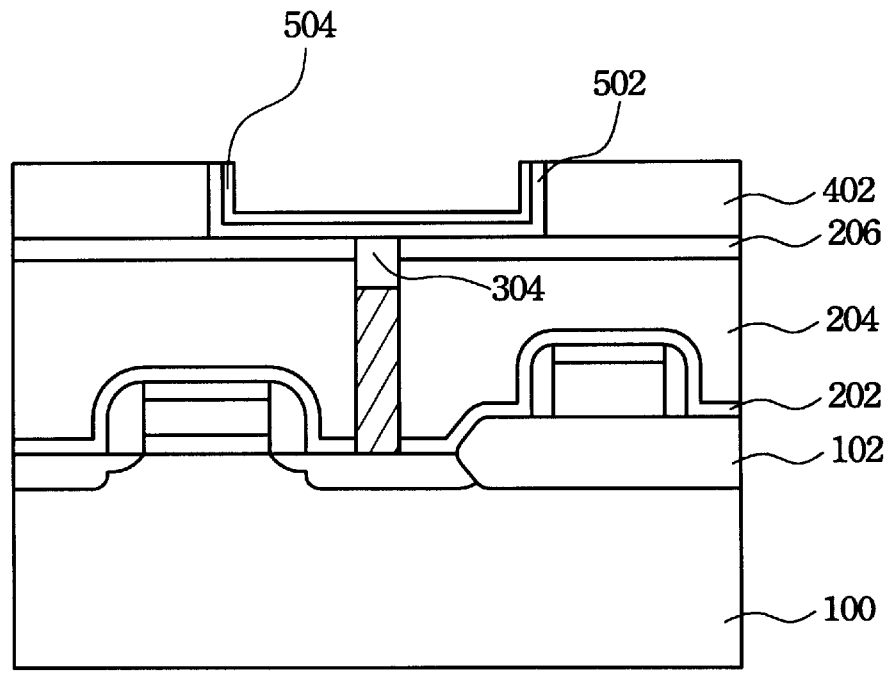
FIG. 7 is a cross-section view of defining the shape of the bottom electrode and removing the photo resist according to present invention.

According to FIG. 5, after forming the crown structure a barrier metal layer 502 is then formed on the surface of the crown structure, namely, the barrier metal layer 502 is formed to cover the W-metal (selective tungsten metal) 304 and the nitride layer 206 which are exposed. The barrier metal layer 502 is use for preventing the reaction between the polysilicon 302 and the platinum layer would be formed in next step, and it also can improve the adhesion between the oxide layer 402 and platinum. Thereof, the barrier metal layer 502 is consisted of TiN. While the barrier metal layer 502 is formed using PVD technique. Otherwise, the TiN could be replaced by using AlTiN for forming the barrier metal layer 502. After that the barrier metal layer 502 is formed, a platinum layer 504 is formed on the barrier metal layer 502 wherein the platinum layer 504 has a thickness of about 500 to 1500 angstroms. Referring to FIG. 6, a photo resist 602 is then formed on the platinum layer 504 wherein the photo resist 602 is use for protecting the platinum layer 504 and the barrier metal layer 502 during subsequent process step. After the photo resist 602 is formed, using CMP technique to remove the photo resist 602, the platinum layer 504 and the barrier metal layer 502 on the silicon oxide layer 402, and to form the bottom electrode of capacitor with precise dimension. Successively, the photo resist 602 in the crown structure is fully removed by using wet etching technique, as shown as FIG. 7.

Figure 8:
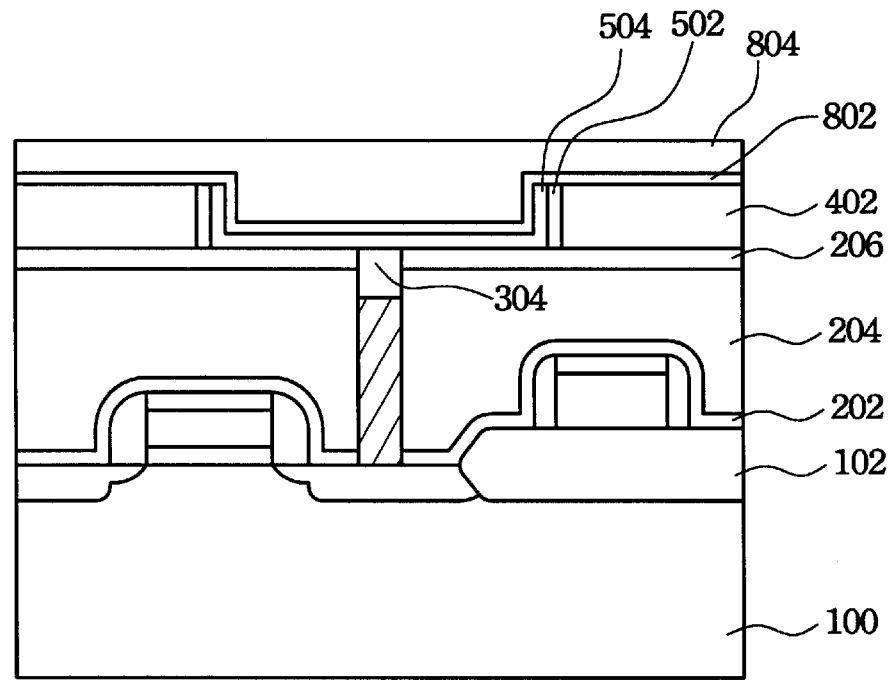
FIG. 8 is a cross-section view of forming a dielectric layer and top electrode subsequently on the bottom electrode according to the present invention.

Finally, referring to FIG. 8, the BST is used as a high dielectric constant material for forming a capacitor dielectric layer 802 on the surface of the platinum layer 504 and the silicon oxide layer 402. Thereof, the BST layer 802 is formed using MOCVD technique, wherein the thickness of the BST layer 802 is about 100 to 300 angstroms. Further, another platinum layer 804 is formed on the BST layer 802 as a top electrode layer, wherein the platinum layer 804 has a thickness of about 1000 to 2000 angstroms.

The method of forming the DRAM crown capacitor in the present invention provides a method to solve the problems during dry etching step while using platinum as the electrodes of the DRAM capacitor. Using selective tungsten metal 304 in the plug and barrier metal layer 502 can prevent the platinum layer 504 react with the polysilicon 302 in the plug. Further, in the invention the nitride layer 206 and the barrier metal layer 502 are use for improving the adhesion between platinum layer 504 and the oxide layer 204, 402.

While the preferred embodiment of the invention has been illustrated and described, it will be appreciated that various changes can be made therein without departing from the spirit and scope of the invention.

What is claimed is:

1. A method of forming a DRAM capacitor, comprising the following steps in the sequence set forth:

forming a first silicon oxide layer on a substrate;

forming a nitride layer on said first silicon oxide layer;

patterning said nitride layer and said first silicon oxide layer to form a contact hole through said nitride layer and said first silicon oxide layer to said substrate;

filling a polysilicon layer into said contact hole;

removing a top part of said polysilicon layer in said contact hole to form a blank part of said contact hole;

filling a W-metal (selective tungsten metal) in said blank part to form a contact plug, forming a second silicon oxide layer on the surfaces of said nitride layer and said W-metal (selective tungsten metal);

patterning said second silicon oxide layer to form a trench, and said W-metal (selective tungsten metal) being exposed in said trench;

forming a barrier metal layer on a surface of said trench and said second silicon oxide in contact with said W-metal;

forming a first metal layer on said barrier metal layer;

forming a dielectric layer on said first metal layer and said second silicon oxide layer; and forming a second metal layer on said dielectric layer.

2. The method according to claim 1, further comprises forming a pad oxide layer on said substrate before forming said first silicon oxide layer.

3. The method according to claim 1, wherein said top part of said polysilicon is removed using reactive ion etching technique.

4. The method according to claim 1, wherein said barrier metal layer is consisted of titanium nitride.

5. The method according to claim 1, wherein said metal barrier layer is consisted of aluminum titanium nitride.

6. The method according to claim 1, wherein said first metal layer and said second metal layer are consisted of platinum.

7. The method according to claim 1, wherein said dielectric layer is consisted of barium strontium titanate.

8. The method according to claim 7, wherein said barium strontium titanate is deposited by using metal-organic chemical vapor deposition.

9. The method according to claim 1, comprising the further steps between the steps for forming said first metal and forming said dielectric layer:

forming a photo resist layer over said first metal layer; and performing planarization of said photo resist layer, said first metal layer and said barrier metal layer to form a bottom electrode of said DRAM capacitor.

10. A method of forming a DRAM capacitor, comprising the following steps in the sequence set forth:

forming a first silicon oxide layer on a substrate;

forming a nitride layer on said first silicon oxide layer;

patterning said nitride layer and said first silicon oxide layer to form a contact hole through said nitride layer and said first silicon oxide layer to said substrate;

filling polysilicon into said contact hole;

removing a top part of said polysilicon in said contact hole to form a blank part of said contact hole;

filling W-metal (selective tungsten metal) in said blank part of said contact hole;

forming a second silicon oxide layer on surfaces of said nitride layer and said W-metal (selective tungsten metal);

patterning said second silicon oxide layer to form a trench, and said W-metal (selective tungsten metal) being exposed in said trench;

forming a barrier metal layer on surfaces of said trench and said second silicon oxide layer and contact with said W-metal;

forming a first metal layer on said barrier metal layer;

forming a photo resist on said first metal layer;

removing said photo resist, said first metal layer and said barrier metal layer on said second silicon oxide layer by planarization, then removing said photo resist in said trench to expose said first metal layer;

forming a dielectric layer on said first metal layer and said second silicon oxide layer; and forming a second metal layer on said dielectric layer.

11. The method according to claim 10, further comprises forming a pad oxide layer on said substrate before forming said first silicon oxide layer.

12. The method according to claim 10, wherein removing top part of said polysilicon is using reactive ion etching technique.

13. The method according to claim 10, wherein said barrier metal layer is consisted of the titanium nitride.

14. The method according to claim 10, wherein said barrier matal layer is consisted of the aluminum titanium nitride.

15. The method according to claim 10, wherein said first metal layer and said second metal layer are consisted of platinum.

16. The method according to claim 10, wherein said dielectric layer is consisted of barium strontium titanate.

17. The method according to claim 10, wherein said barium strontium titanate is deposited by using metal-organic chemical vapor deposition.

* * * * *